(12) United States Patent
Hodono

(10) Patent No.: US 7,760,981 B2
(45) Date of Patent: Jul. 20, 2010

(54) MANUFACTURING METHOD OF OPTICAL WAVEGUIDE DEVICE, OPTICAL WAVEGUIDE DEVICE OBTAINED THEREBY, AND OPTICAL WAVEGUIDE CONNECTING STRUCTURE USED FOR THE SAME

(75) Inventor: Masayuki Hodono, Ibaraki (JP)

(73) Assignee: Nitto Denko Corporation, Ibaraki-Shi, Osaka (JP)

(*) Notice: Subject to any disclaimer, the term of this patent is extended or adjusted under 35 U.S.C. 154(b) by 0 days.

(21) Appl. No.: 12/357,748

(22) Filed: Jan. 22, 2009

(65) Prior Publication Data
US 2009/0185775 A1 Jul. 23, 2009

Related U.S. Application Data

(60) Provisional application No. 61/028,683, filed on Feb. 14, 2008.

(30) Foreign Application Priority Data

Jan. 22, 2008 (JP) .............................. 2008-011886

(51) Int. Cl.
  *G02B 6/10* (2006.01)
  *G02B 6/12* (2006.01)
(52) U.S. Cl. ......................................... 385/132; 385/14
(58) Field of Classification Search .................. 385/14, 385/132; 264/1.24
See application file for complete search history.

(56) References Cited

U.S. PATENT DOCUMENTS 6,099,366 A * 8/2000 Shinchi ....................... 439/877

| 6,425,695 | B1 | 7/2002 | Murata et al. |
| 7,146,065 | B2 * | 12/2006 | Niitsu et al. ................... 385/14 |
| 7,184,628 | B2 * | 2/2007 | Kuhara ......................... 385/37 |
| 7,441,965 | B2 | 10/2008 | Furuno et al. |

FOREIGN PATENT DOCUMENTS

| EP | 1 022 822 A1 | 7/2000 |
| JP | 58-85579 A | 5/1983 |

(Continued)

OTHER PUBLICATIONS

European Search Report dated Jun. 4, 2009, issued in corresponding European Patent Application No. 09000769.1.

*Primary Examiner*—Charlie Peng
(74) *Attorney, Agent, or Firm*—Westerman, Hattori, Daniels & Adrian, LLP

(57) ABSTRACT

A method of manufacturing optical waveguide device, comprising steps of: preparing optical waveguide including under cladding layer and protruding core pattern formed on the under cladding layer; preparing mold having protrusions for shaping recesses for fitting with predetermined portions of the core pattern; preparing board provided with light-receiving/emitting element mounted thereon; placing the mold around the light-receiving/emitting element for positioning top surfaces of the protrusions of the mold over light-receiving/emitting portions of the light-receiving/emitting element; filling the mold with sealing resin material and hardening the material in the mold to form sealing resin layer having recesses for fitting with the core pattern; after removing the sealing resin layer from the mold, the core pattern are fitted with the recesses of the resin layer to optically couple the light-receiving/emitting portions and the optical waveguide; and forming an over cladding layer for covering the remaining portion of the core pattern.

2 Claims, 6 Drawing Sheets

FOREIGN PATENT DOCUMENTS

| | | |
|---|---|---|
| JP | 63-280206 A | 11/1988 |
| JP | 11-202158 A | 7/1999 |
| JP | 2002-62459 A | 2/2002 |
| JP | 2003-140008 A | 5/2003 |
| JP | 2006-309113 A | 11/2006 |

* cited by examiner

MANUFACTURING METHOD OF OPTICAL WAVEGUIDE DEVICE, OPTICAL WAVEGUIDE DEVICE OBTAINED THEREBY, AND OPTICAL WAVEGUIDE CONNECTING STRUCTURE USED FOR THE SAME

RELATED APPLICATIONS

This application claims the benefit of U.S. Provisional Application No. 61/028,683, filed on Feb. 14, 2008, which is hereby incorporated by reference.

BACKGROUND OF THE INVENTION

1. Field of the Invention

The present invention relates to a manufacturing method of an optical waveguide device for widespread use in optical communications, optical information processing and other general optics, an optical waveguide device obtained thereby, and an optical waveguide connecting structure used for the same.

2. Description of the Related Art

In general, an optical waveguide device achieves optical coupling by causing an optical waveguide to propagate a light beam emitted from a light-emitting element or causing a light-receiving element to receive a light beam propagated by the optical waveguide. For the coupling, it is important to set their optical axes coaxially, and high positioning accuracy is required.

For example, there has been proposed a connector in which a light-receiving and light-emitting element mounted in precise alignment with a positioning plate and a three-dimensional optical path component (containing an optical waveguide) precisely aligned with the positioning plate by the fitting engagement between a protrusion and a recess are combined with each other, whereby the light-receiving and light-emitting element and the optical waveguide are aligned with each other with high accuracy (see Japanese Patent Application Laid-Open No-2006-309113).

However, this connector requires the two steps of: initially precisely aligning the light-receiving and light-emitting element with the positioning plate, and then precisely assembling the three-dimensional optical path component relative to the positioning plate. This presents the problem of requiring cumbersome and complicated labor and time which results in poor production efficiency. Further, not only high machining accuracy is required for the positioning plate and the three-dimensional optical path component, but also the assembly accuracy of the positioning plate and the three-dimensional optical path component is important. Thus, there arises another problem in that it is not easy to adjust the accuracies.

SUMMARY OF THE INVENTION

In view of the foregoing, it is an object of the present invention to provide a method of manufacturing an optical waveguide device which is capable of optically coupling a light-receiving and light-emitting element and an optical waveguide to each other with good accuracy by a simple process, an optical waveguide device obtained thereby, and an optical waveguide connecting structure used for the same.

To accomplish the above-mentioned object, a first aspect of the present invention is intended for a method of manufacturing an optical waveguide device, which comprises the steps of: preparing an optical waveguide including an under cladding layer and a protruding core pattern formed on the under cladding layer; preparing a mold formed with protruding portions for shaping of recessed portions for fitting engagement with predetermined portions of the protruding core pattern of the optical waveguide; preparing a board having an upper surface with a light-receiving and light-emitting element mounted thereon; placing the mold around the mounted light-receiving and light-emitting element to accomplish positioning so that top surfaces of the shaping protruding portions of the mold lie over light-receiving and light-emitting portions of the light-receiving and light-emitting element; filling the mold with a sealing resin material and hardening the sealing resin material in the mold to form a sealing resin layer provided with the recessed portions for fitting engagement with the predetermined portions of the protruding core pattern of the optical waveguide; after removing the sealing resin layer from the mold, bringing the predetermined portions of the protruding core pattern of the optical waveguide into fitting engagement with the recessed portions of the sealing resin layer to optically couple the light-receiving and light-emitting portions of the light-receiving and light-emitting element and the optical waveguide to each other; and forming an over cladding layer for covering the remaining portion of the protruding core pattern of the optical waveguide.

In particular, a second aspect of the present invention is intended for a method of manufacturing an optical waveguide device, wherein a transparent mold made of at least one selected from the group consisting of quartz glass and silicon is used as the mold, whereby the interior of the mold is seen through the mold when the mold is positioned so that the top surfaces of the protruding portions formed in the mold lie over the light-receiving and light-emitting portions of the light-receiving and light-emitting element.

A third aspect of the present invention is intended for an optical waveguide device, which comprises: an optical waveguide including an under cladding layer and a protruding core pattern formed on the under cladding layer; a light-receiving and light-emitting element mounted on an upper surface of a board; and a sealing resin layer for sealing the light-receiving and light-emitting element, the sealing resin layer being formed with recessed portions for fitting engagement with predetermined portions of the protruding core pattern of the optical waveguide, said recessed portions being positioned so that bottom surfaces of the recessed portions lie over light-receiving and light-emitting portions of the light-receiving and light-emitting element, wherein the light-receiving and light-emitting portions of the light-receiving and light-emitting element and the optical waveguide are optically coupled to each other by fitting engagement between the recessed portions of the sealing resin layer and the predetermined portions of the protruding core pattern of the optical waveguide, and wherein the remaining portion of the protruding core pattern of the optical waveguide is covered with an over cladding layer.

A fourth aspect of the present invention is intended for an optical waveguide connecting structure used for an optical waveguide device, which comprises: an optical waveguide including an under cladding layer and a protruding core pattern formed on the under cladding layer; a light-receiving and light-emitting element mounted on an upper surface of a board; and a sealing resin layer for sealing the light-receiving and light-emitting element, the sealing resin layer being formed with recessed portions for fitting engagement with predetermined portions of the protruding core pattern of the optical waveguide, the recessed portions being positioned so that bottom surfaces of the recessed portions lie over light-receiving and light-emitting portions of the light-receiving and light-emitting element, wherein the light-receiving and light-emitting portions of the light-receiving and light-emitting element and the optical waveguide are optically coupled to each other by fitting engagement between the recessed portions of the sealing resin layer and the predetermined portions of the protruding core pattern of the optical waveguide.

As used in the present invention, the expression "to accomplish positioning so that top surfaces of shaping protruding portions . . . lie over light-receiving and light-emitting portions of a light-receiving and light-emitting element" is not limited to laying the top surfaces directly on the light-receiving and light-emitting portions but is to be interpreted as including meaning that both are opposed to each other in spaced apart relation. Likewise, as used in the present invention, the expression "recessed portions are positioned so that bottom surfaces of the recessed portions lie over light-receiving and light-emitting portions of a light-receiving and light-emitting element" is not limited to laying the bottom surfaces of the recessed portions directly on the light-receiving and light-emitting portions but is to be interpreted as including meaning that both are opposed to each other in spaced apart relation.

The present inventor has diligently made studies of a method of optically coupling the light-receiving and light-emitting element and the optical waveguide to each other easily while the light-receiving and light-emitting element and the optical waveguide are positioned with high accuracy. As a result, the present inventor has found that the light-receiving and light-emitting element and the optical waveguide are optically coupled to each other easily and precisely by the use of the optical waveguide in which the protruding core pattern is exposed and also by the following process: forming the recessed portions for fitting engagement with the protruding core pattern of the optical waveguide in a position opposed to the light-receiving and light-emitting portions of the light-receiving and light-emitting element, and bringing the protruding core pattern of the optical waveguide into directly fitting engagement with the recessed portions at the same time that the light-receiving and light-emitting element on the board is sealed with resin. Thus, the present inventor has attained the present invention.

In the method of manufacturing the optical waveguide device according to the present invention as described above, the optical waveguide in which the protruding core pattern is exposed is used. On the other hand, the recessed portions for fitting engagement with the protruding core pattern of the optical waveguide are formed in a position opposed to the light-receiving and light-emitting portions of the light-receiving and light-emitting element, and the protruding core pattern of the optical waveguide is brought into directly fitting engagement with the recessed portions at the same time that the light-receiving and light-emitting element on the board is sealed with resin. According to this method, the light-receiving and light-emitting element and the optical waveguide are optically coupled to each other easily with good accuracy by the fitting engagement between the above-mentioned recessed and protruding portions. Therefore, the present manufacturing method eliminates the conventional cumbersome and complicated labor to offer the advantage of significantly reducing manufacturing costs and operating time.

In particular, the manufacturing method, in which a transparent mold made of at least one selected from the group consisting of quartz glass and silicon is used as the mold, whereby the interior of the mold is seen through the mold when the mold is positioned so that the top surfaces of the protruding portions formed in the mold lie over the light-receiving and light-emitting portions of the light-receiving and light-emitting element, offers the advantage of easily performing the positioning process when the mold is placed.

The optical waveguide device according to the present invention is capable of transmitting light with high efficiency because the light-receiving and light-emitting element and the optical waveguide are optically coupled to each other while being positioned with high accuracy by bringing the recessed and protruding portions provided therein into direct fitting engagement with each other.

The optical waveguide connecting structure used for the above-mentioned optical waveguide device offers the advantage of achieving high-efficiency optical transmission with low optical coupling losses easily at low costs.

DESCRIPTION OF THE PREFERRED EMBODIMENTS

Next, the present invention will be described in detail using a preferred embodiment in which an optical waveguide device is manufactured by optically coupling a light-receiving element and an optical waveguide to each other.

Figure 1:
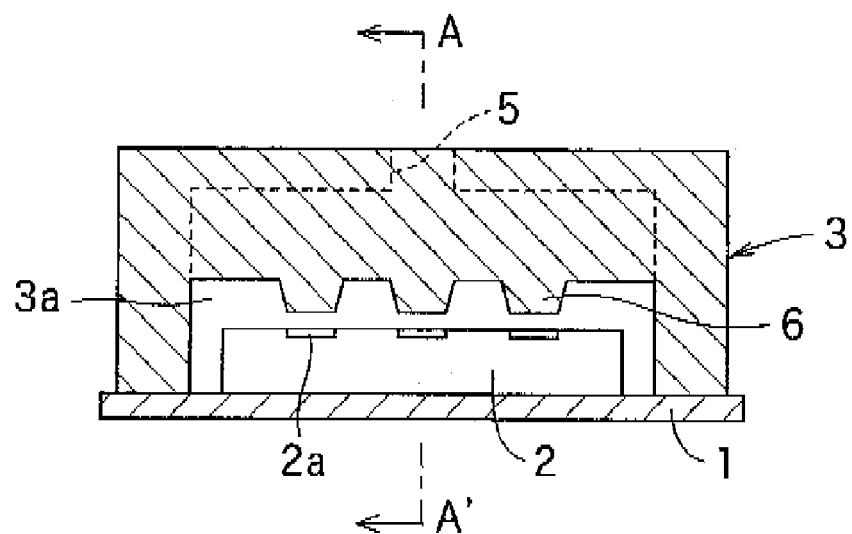
FIG. 1(a) is an illustration of a manufacturing process of an optical waveguide device according to one preferred embodiment of the present invention.
FIG. 1(b) is a sectional view taken along the line A-A' of FIG. 1(a).
Figure 1:
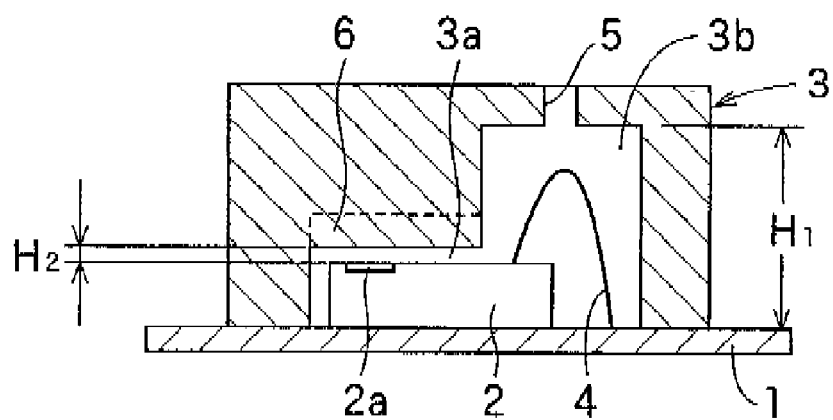

According to this preferred embodiment, as shown in FIG. 1(a), a board 1 of a flat or sheet-like shape is initially prepared, and a light-receiving element 2 is mounted in a predetermined position on the upper surface of the board 1. Thereafter, a mold (rectangular in shape as seen in plan view) 3 is placed around the light-receiving element 2. FIG. 1(b) is a sectional view taken along the line A-A' of FIG. 1(a).

Examples of a material for the formation of the board 1 include glass, quartz glass, silicon, resins, and metals. The thickness of the board 1 is appropriately determined depending on the material and required characteristics thereof. When the board 1 is a flexible printed circuit (FPC) board including, for example, polyester resins (PET), polycarbonate resins (PC), polyethylene naphthalate resins (PEN) as a base material, the board 1 preferably has a thickness typically in the range of 30 μm to 300 μm. When the board 1 is a rigid circuit board including a glass board or a quartz board as a base, the board 1 preferably has a thickness typically in the range of 1 mm to 5 mm.

Examples of the light-receiving element 2 include an unsealed photodiode (PD) array chip, an unsealed phototransistor. In this embodiment, an array chip including three light-receiving portions 2a arranged horizontally in a line and each comprised of a photodiode is used as the light-receiving element 2. The mounting of this light-receiving element 2 onto the board 1 is carried out by wire bonding or the like. In the figures, the reference numeral 4 designates a bonding wire.

Further, the mold 3 is used to seal the mounted light-receiving element 2 with resin, and includes a cavity 3*a* for principally sealing the light-receiving element 2, a cavity 3*b* for principally sealing the bonding wire 4, and a resin inlet 5. A ceiling surface of the mold 3 in the cavity 3*a* is provided with protruding portions 6 protruding downwardly in opposed relation to the light-receiving portions 2*a*, respectively, of the light-receiving element 2. The top surfaces of the respective protruding portions 6 are disposed to lie directly over the light-receiving portions 2*a*, respectively, of the light-receiving element 2.

Examples of the material of the mold 3 include metals, resins, silicon, and quartz glass. In particular, the mold 3 is preferably a transparent mold made of quartz glass, silicon or the like. Specifically, when the mold 3 is transparent, the mold 3 has an advantage in facilitating the positioning process thereof because the interior of the mold 3 is seen through the transparent mold 3 during the positioning so that it is easy to identify the position at which the top surfaces of the protruding portions 6 in the mold 3 lie over the light-receiving portions 2*a* of the light-receiving element 2.

When an opaque metal mold is used as the mold 3, active alignment is performed, for example, by providing alignment marks (not shown) in the mold 3 and the board 1, respectively, and then imaging the alignment marks from the backside of the board 1. In this case, it is preferable that the alignment marks are directly engraved on the mold 3 and the alignment marks are formed on the board 1 by printing or Cu plating.

It is desirable that each of the left-hand and right-hand side surfaces of the protruding portions 6 of the mold 3 has a draft as shown. When the protruding portions 6 with the draft are used, the slope is also transferred to the left-hand and right-hand side surfaces of recessed portions 8 with reference to FIG. 2(*a*) of a sealing resin layer 7 to be shaped by the protruding portions 6. This offers an advantage in that a protruding core pattern 11 (see FIG. 3) of an optical waveguide is easily fitted in the recessed portions 8 to achieve optical coupling, which will be described later.

It is necessary that the ceiling height $H_1$ of the cavity 3*b* of the mold 3 for principally sealing the bonding wire 4 be set at a height sufficient to prevent the bonding wire 4 of the light-receiving element 2 from contacting the ceiling surface. This is to ensure the sealing with resin without a break in the bonding wire 4 due to pressing of the ceiling surface against the bonding wire 4. A gap size $H_2$ between the top surfaces of the protruding portions 6 and the light-receiving portions 2*a* in the cavity 3*a* for principally sealing the light-receiving element 2 is preferably as small as possible in consideration for the optical transmission efficiency of the cores of the optical waveguide for fitting engagement with this portion and the light-receiving portions 2*a*. Preferably, the gap size $H_2$ is typically in the range of 0 μm to 50 μm. When the gap size $H_2$ is equal to zero, the sealing resin layer is not formed on the light-receiving portions 2*a* but the protruding core pattern 11 is directly fitted in the upper surface of the light-receiving portions 2*a* (see FIG. 7) which will be described later.

Figure 2:
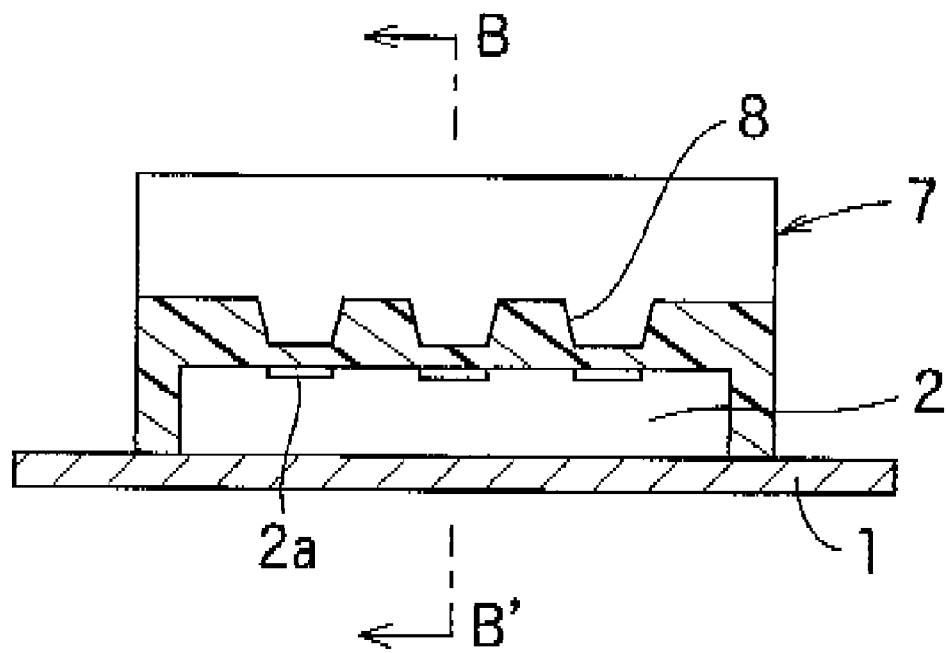
FIG. 2(a) is an illustration of the above-mentioned manufacturing process.
FIG. 2(b) is a sectional view taken along the line B-B' of FIG. 2(a).
Figure 2:
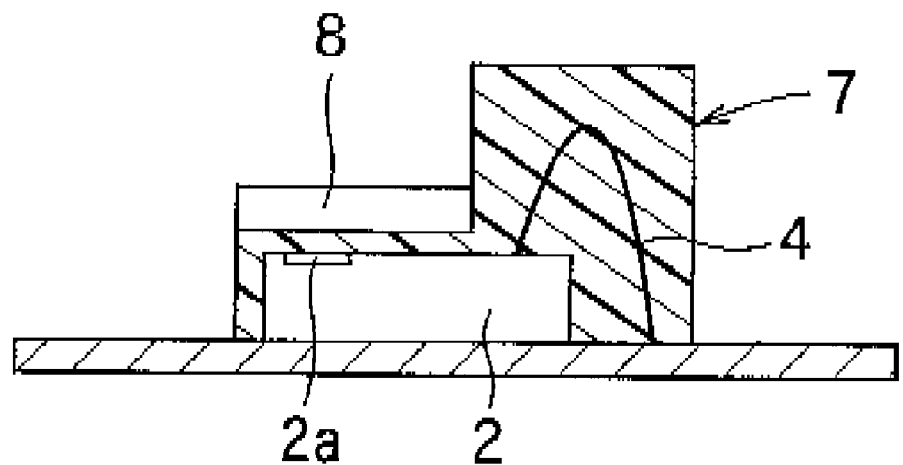

Next, a sealing resin material is charged into and hardened in the mold 3 to form the sealing resin layer 7 which in turn is removed from the mold 3. In this manner, an intermediate product is provided in which the light-receiving element 2 is sealed by the sealing resin layer 7 and in which the upper surface of the sealing resin layer 7 is formed with the recessed portions 8 for fitting engagement with the protruding core pattern of the optical waveguide to be described later, as shown in FIG. 2(*a*). FIG. 2(*b*) is a sectional view taken along the line B-B' of FIG. 2(*a*).

In general, the above-mentioned sealing resin material used herein is preferably a material used widely as a material for the formation of a core layer for an optical waveguide. Examples of such a material include photosensitive resins such as photosensitive epoxy resins, photosensitive polyimide resins, photosensitive polyamide resins or photosensitive silicone resins, and thermosetting resins such as non-photosensitive epoxy resins or polyimide resins. These are typically dissolved in a solvent and used in the form of a varnish. In particular, a varnish using photosensitive epoxy resins is preferable.

When a photosensitive resin is used, the hardening of the sealing resin material is typically achieved by spot irradiation with ultraviolet light. The dose of the ultraviolet light is typically 100 mJ/cm$^2$ to 5000 mJ/cm$^2$, preferably 2000 mJ/cm$^2$ to 3000 mJ/cm$^2$. The time required for the irradiation is 1 to 3 seconds. When a non-photosensitive thermosetting resin such as a polyimide resin is used, the hardening is typically achieved by a heating treatment at 300° C. to 400° C. for 60 to 180 minutes.

Figure 3:
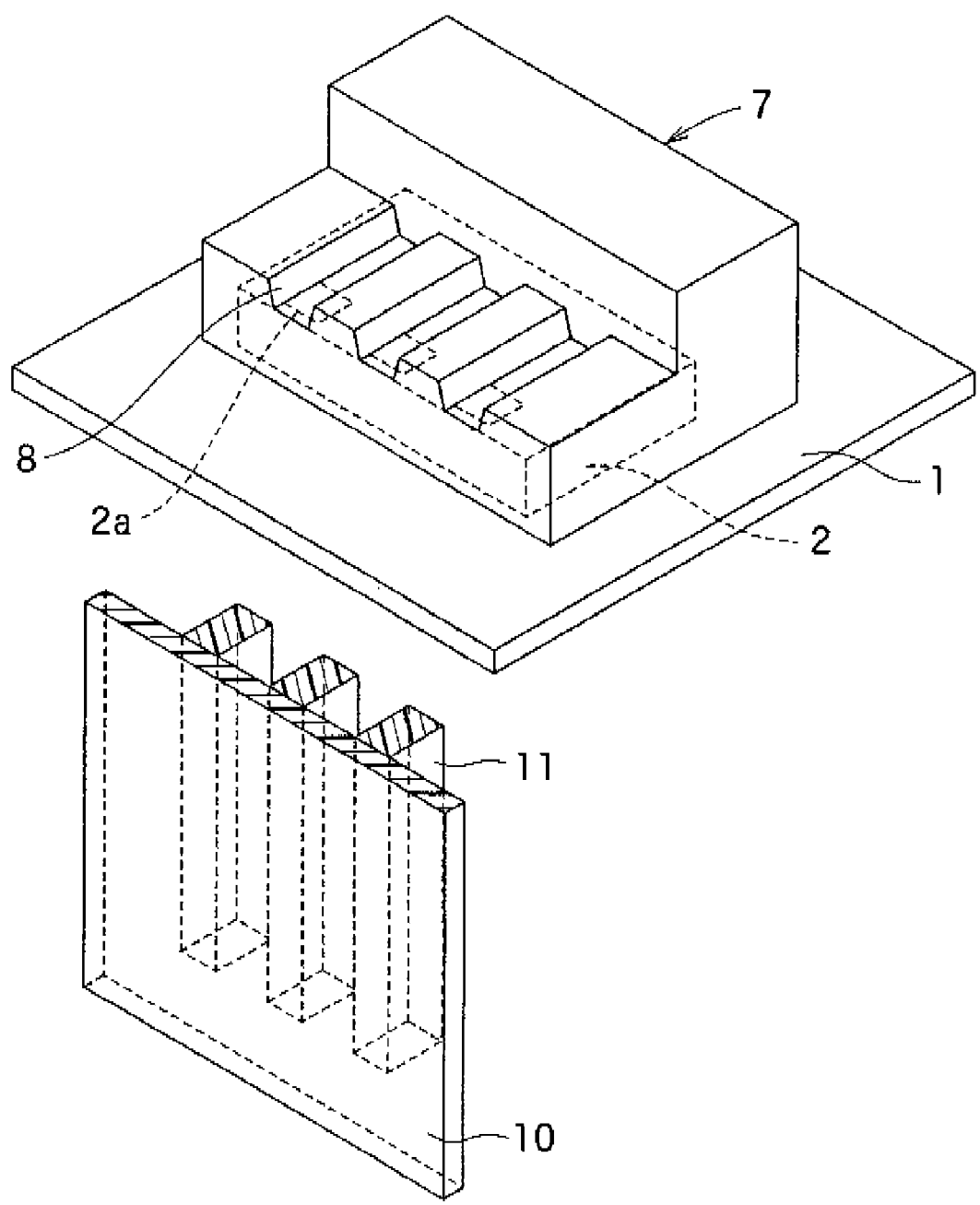
FIG. 3 is an illustration of the above-mentioned manufacturing process.

On the other hand, as shown in FIG. 3, an optical waveguide film is produced by forming the core pattern 11 composed of three protruding cores extending in parallel with each other on one surface of an elongated film-like under cladding layer 10. An over cladding layer is not provided on the core pattern 11, so that the core pattern 11 in the protruding configuration remains exposed.

The under cladding layer 10 is a film made of a typical material for the formation of an under cladding such as photosensitive resins, polyimide resins or epoxy resins. The thickness of the under cladding layer 10 is not particularly limited.

Figure 4:
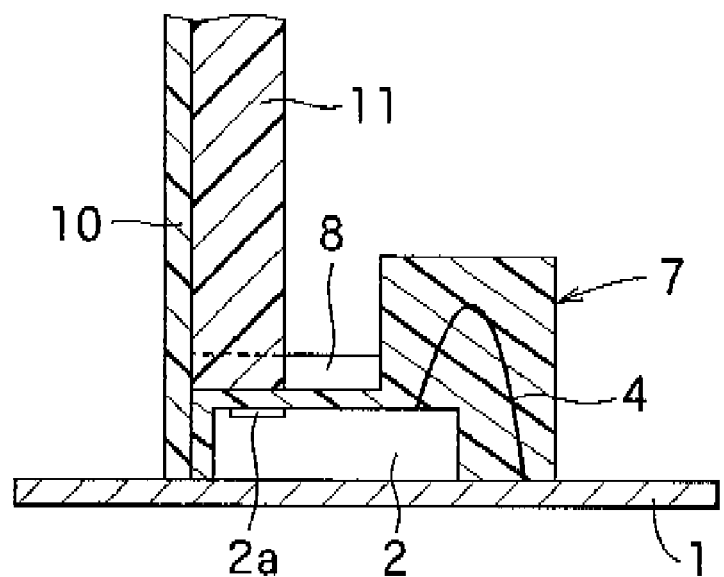
FIGS. 4(a) and 4(b) are illustrations of the above-mentioned manufacturing process.
Figure 4:
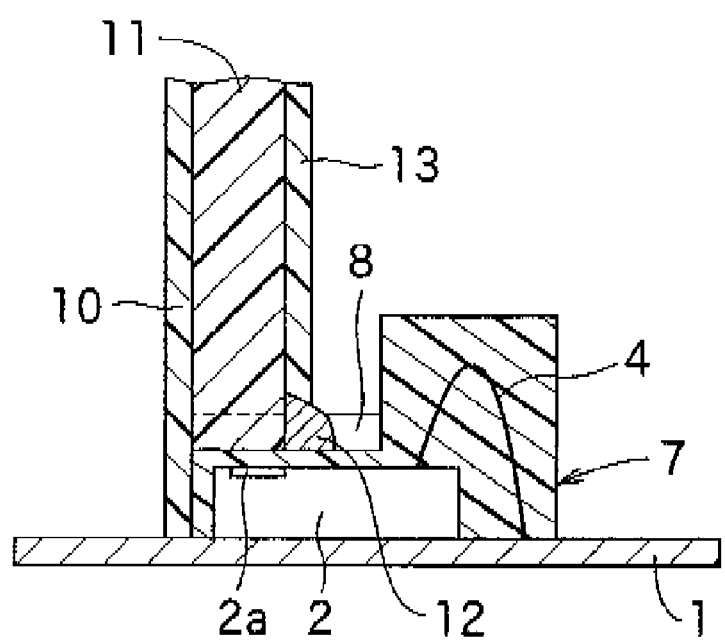

A material for the formation of the core pattern 11 may be a typical material for the formation of the core layer such as photosensitive resins, polyimide resins or epoxy resins, but is required to provide the protruding cores of the core pattern 11 having a refractive index greater than that of the under cladding layer 10 and that of an over cladding layer 13 (with reference to FIG. 4(*b*)) to be described later. The refractive index may be adjusted, for example, by selecting the types of the materials for the formation of the under cladding layer 10, the core pattern 11 and the over cladding layer 13, and adjusting the compositions thereof.

A method of forming the core pattern 11 is not particularly limited. However, the core pattern 11 is obtained, for example, by the process of: applying a varnish prepared by dissolving a resin serving as the material for the formation of the cores in a solvent to the upper surface of the under cladding layer 11 by a spin coating method, a dipping method, a casting method, an injection method, an ink jet method and the like; then transferring a predetermined pattern onto the applied varnish and developing the applied varnish by a photolithographic process or the like; and removing an unnecessary portion of the applied varnish.

The thickness of the core pattern 11 is not particularly limited, but must be configured in consideration for the fitting engagement with the recessed portions 8 of the sealing resin layer 7 of the product which resin-seals the light-receiving element 2 by using the protruding shape of the core pattern 11.

The optical waveguide film thus obtained is placed in a vertically standing condition relative to the board 1 with the light-receiving element 2 mounted and resin-sealed thereon, for example, as shown in FIG. 3. Then, an end surface of the core pattern 11 is fitted into the recessed portions 8 of the sealing resin layer 7, as shown in FIG. 4(a). The tip portions of the three protruding cores of the core pattern 11 are opposed to the three light-receiving portions 2a, respectively, of the light-receiving element 2. This allows the optical waveguide film and the light-receiving element 2 to be optically coupled to each other while being precisely positioned relative to each other.

In this state, a resin material conventionally used widely, for example, as a material for the formation of a cladding layer of an optical waveguide is injected into and hardened in the engaging portions as a resin material for sealing the engaging portions to fix the fitting engagement between the end surface of the core pattern 11 and the recessed portions 8. Then, in a manner similar to that described above, a resin material conventionally widely used, for example, as a material for the formation of the cladding layer of the optical waveguide is used to cover portions of the optical waveguide film where the core pattern 11 is exposed, and is hardened, thereby forming the over cladding layer 13, as shown in FIG. 4(b). In this manner, the optical waveguide device is obtained in which the optical waveguide film including the core pattern 11 covered with the under cladding layer 10 and the over cladding layer 13, and the light-receiving element 2 are optically coupled to each other. In FIG. 4(b), the reference numeral 12 designates the hardened resin material for fixing the fitting engagement between the end surface of the core pattern 11 and the recessed portions 8.

Examples of the resin material for sealing the engaging portions include photosensitive resins such as photosensitive epoxy resins, photosensitive polyimide resins, photosensitive polyamide resins or photosensitive silicone resins, and thermosetting resins such as non-photosensitive epoxy resins, or polyimide resins. These are typically dissolved in a solvent and used in the form of a varnish. In particular, a varnish using photosensitive epoxy resins is preferable.

An example of the resin material for the formation of the over cladding layer 13 may be similar to that described above. For the suppression of the loss of light emitted from the cores constituting the core pattern 11, it is, however, preferable to set the optical refractive index of the over cladding layer 13 lower than that of the cores.

In the optical waveguide device thus obtained, the light-receiving element 2 and the core pattern 11 serving as the optical waveguide are optically coupled to each other while their optical axes are aligned with each other with high accuracy. This provides a small amount of optical loss in the optically coupled portions to achieve the transmission of light with high efficiency.

The above-mentioned method of manufacturing the optical waveguide device is capable of achieving the high-accuracy alignment easily by the fitting engagement between the protruding portions and the recessed portions to manufacture the optical waveguide device of high quality in a short time without much labor, thereby producing high practical effects.

In the above-mentioned preferred embodiment, the optical waveguide film is placed in a vertically standing condition relative to the board 1 with the light-receiving element 2 mounted thereon, and the end surface of the core pattern 11 of the optical waveguide film is fitted into the recessed portions 8 of the sealing resin layer 7 sealing the light-receiving element 2, whereby the fitting engagement therebetween is effected. The form of fitting engagement, however, is not limited to this, but may be appropriately modified.

Figure 5:
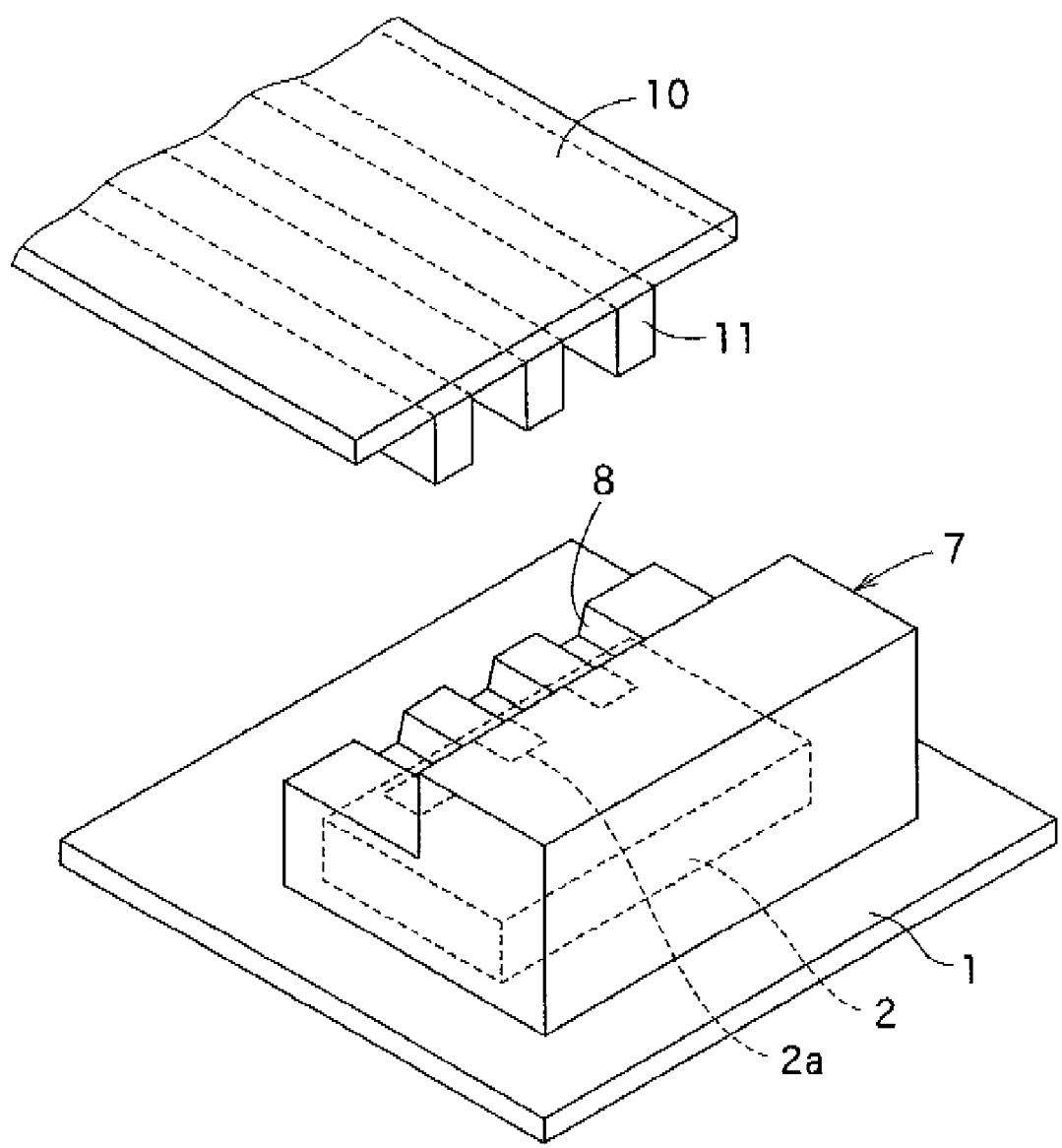
FIG. 5 is an illustration of a modification of the form of mounting in the above-mentioned manufacturing process.
Figure 6:
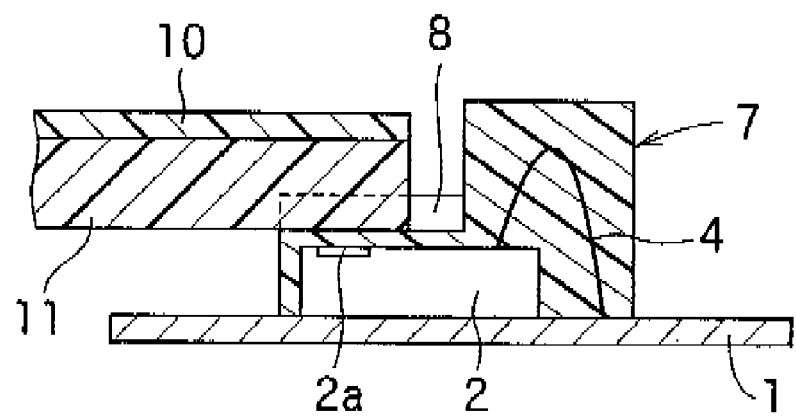
FIG. 6 is an illustration of the manufacturing process of the above-mentioned modification.

For example, as shown in FIG. 5, the optical waveguide film may be placed in parallel to the board 1 with the light-receiving element 2 mounted thereon, and the fitting engagement may be effected while the longitudinal direction of the core pattern 11 of the optical waveguide film and the longitudinal direction of the recessed portions 8 of the sealing resin layer 7 sealing the light-receiving element 2 are aligned with each other in the same direction. A condition in which the fitting engagement is effected is shown in FIG. 6. In this case, the optical coupling of the engaging portions allows the transmission of light with high efficiency in a manner similar to that of the above-mentioned embodiment.

Figure 7:
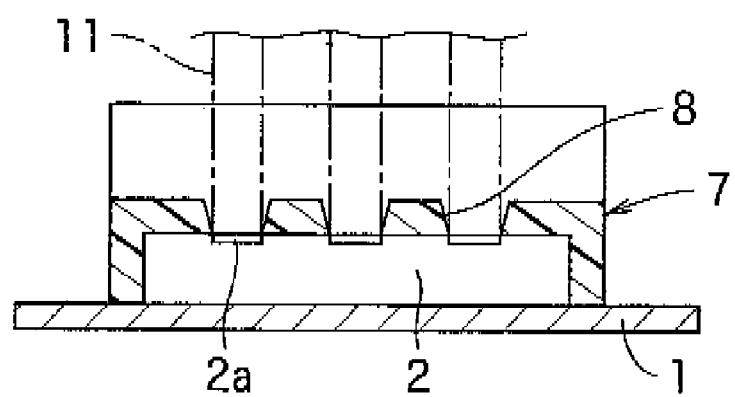
FIG. 7 is an illustration of another preferred embodiment of the present invention.

In the above embodiment, the upper surface of the light-receiving element 2 is completely covered with the sealing resin layer 7, and the thickness portion of the sealing resin layer 7 is used to produce unevenness, thereby providing the recessed portions 8 for the fitting engagement with the core pattern 11 of the optical waveguide film. Alternatively, as shown in FIG. 7, the sealing resin layer 7 may be provided in the form of stripes spaced at predetermined intervals on the upper surface of the light-receiving element 2, and the upper surface of the light-receiving element 2 may be used as the bottom surface of the recessed portions 8 for the fitting engagement with the core pattern 11 of the optical waveguide film. This embodiment is such a preferred embodiment that $H_2=0$ with reference to FIG. 1(b) as mentioned above.

Further, the optical waveguide film is used as the optical waveguide in the above embodiment. However, when a plate-like optical waveguide or the like which is entirely inflexible is used, effects similar to those of the above embodiment are produced by providing the protruding core pattern 11 on the surface of the plate-like optical waveguide or the like and bringing the core pattern 11 into fitting engagement with the recessed portions 8 of the sealing resin layer 7 formed on the upper surface of the light-receiving element 2 in a manner similar to that of the above embodiment.

In the above embodiment, the array-type light-receiving element 2 provided with the plurality of light-receiving portions 2a and the core pattern 11 including the plurality of elongated protruding portions are brought into fitting engagement with each other to achieve a plurality of optical couplings. However, a single optical waveguide may be optically coupled to a single light-receiving portion 2a.

In the above embodiment, the present invention is applied to a method of manufacturing an optical waveguide device in which the light-receiving element 2 and the core pattern 11 of the optical waveguide film or the like are optically coupled to each other. However, the present invention is not limited to this, but is applicable to a method of manufacturing an optical waveguide device in which a light-emitting element and the core pattern 11 of the optical waveguide film or the like are optically coupled to each other. For illustration purposes, element 2 is exemplary of either the light-emitting element or the light-receiving element and element 2a is exemplary of either the light-emitting portion of the light-emitting element or the light-receiving portion of the light-receiving element.

Next, an example of the present invention will be described. It should be noted that the present invention is not limited to the inventive example to be described below.

EXAMPLE

Preparation of Optical Waveguide Film

An optical waveguide film for transmission of an optical signal was prepared in which a protruding core pattern with Line/Space=50 μm/125 μm and a height of 80 μm was formed on a surface of an under cladding layer having a thickness of 20 μm and made of epoxy resin.

Mounting of Light-Receiving Element

A flexible printed circuit (FPC) board including a polyimide resin sheet having a thickness of 50 μm as a base was used as a board. An unsealed PD array chip (including light-receiving portions having a size of 62.5 μm×50 μm and spaced at intervals of 125 μm) serving as a light-receiving element was connected to and mounted in a predetermined position on the flexible printed circuit board by wire bonding.

Preparation of Mold

A transparent resin mold was prepared by pouring polymethyl methacrylate (PMMA resin) into an ultra-precision metal mold. This mold was provided with a resin inlet, a wire bonding sealing cavity, and a light-receiving element body sealing cavity. A ceiling surface of the mold in the body sealing cavity was formed with protruding portions protruding downwardly and having top surfaces in opposed relation to the light-receiving portions, respectively, of the light-receiving element (with reference to FIGS. 1(a) and 1(b)).

Preparation of Sealing Resin Material

A sealing resin material was prepared by dissolving 70 parts by weight of bisphenoxyethanolfluorene diglycidyl ether (component A), 30 parts by weight of 1,3,3-tris{4-[2-(3-oxetanyl)]butoxyphenyl}butane and 0.5 part by weight of a 50% propione carbonate solution of 4,4-bis[di(β-hydroxyethoxy)phenylsulfinio]phenylsulfide-bis-hexafluoroantimonate (photo-acid generator: component B) in 28 parts by weight of ethyl lactate.

Sealing of Light-Receiving Element

Then, the light-receiving element mounted on the board was surrounded by the mold. The sealing resin material was injected through the resin inlet into the mold and hardened therein to seal the light-receiving element and the bonding wire. The hardened sealing resin material was removed from the mold. This provided an intermediate product in which the light-receiving element was sealed with the resin with reference to FIGS. 2(a) and 2(b).

Preparation of Engaging Portion Sealing Resin Material

A resin material for sealing engaging portions to be described later was prepared by mixing together 35 parts by weight of the component A, 40 parts by weight of (3',4'-epoxycyclohexane) methyl-3',4'-epoxycyclohexyl-carboxylate, 25 parts by weight of an alicyclic epoxy resin (Celloxide 2021P manufactured by Daicel Chemical Industries, Ltd.), and one part by weight of the component B.

Fitting Engagement Between Recessed and Protruding Portions and Fixing Thereof by Sealing Next, the optical waveguide film with the protruding core pattern exposed was placed in a vertical position relative to the intermediate product in which the light-receiving element was sealed with the resin. The protruding core pattern of the optical waveguide film was fitted in recessed portions provided in the upper surface of a sealing resin layer, whereby both were brought into fitting engagement with each other. An optical waveguide of the optical waveguide film and the light-receiving portions of the light-receiving element were optically coupled to each other while being precisely aligned with each other. The resin material for sealing the engaging portions was dripped onto engaging portions of the protruding core pattern and the recessed portions. The resin material was hardened by spot irradiation of the resin material with ultraviolet light. Thus, the engaging portions were sealed and fixed.

Protection of Optical Waveguide Film

A resin material similar to that prepared for sealing of the optically coupled portions was dripped onto the optical waveguide film integrated with the light-receiving element, and was slightly leveled with a spin coater. Thereafter, the resin material was hardened by irradiating the resin material with ultraviolet light to form an over cladding layer covering the exposed protruding core pattern. In this manner, an intended optical waveguide device was obtained.

This optical waveguide device showed that the amount of light entering the light-receiving element through the optical waveguide was 60% to 90% of the amount of light obtained when complete alignment was performed by active alignment, thereby achieving low optical coupling losses and high quality.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. A method of manufacturing an optical waveguide device, comprising the steps of:
   preparing an optical waveguide including an under cladding layer and a protruding core pattern formed on the under cladding layer;
   preparing a mold formed with protruding portions for shaping of recessed portions for fitting engagement with predetermined portions of the protruding core pattern of said optical waveguide;
   preparing a board having an upper surface with a light-receiving element or a light-emitting element mounted thereon;
   placing said mold around said mounted light-receiving element or light-emitting element to accomplish positioning so that top surfaces of the shaping protruding portions of said mold lie over light-receiving portions of said light-receiving element or light-emitting portions of said light-emitting element;
   filling said mold with a sealing resin material and hardening the sealing resin material in said mold to form a sealing resin layer provided with the recessed portions for fitting engagement with the predetermined portions of the protruding core pattern of said optical waveguide;
   after removing the sealing resin layer from the mold, bringing the predetermined portions of the protruding core pattern of said optical waveguide into fitting engagement with the recessed portions of said sealing resin layer to optically couple the light-receiving portions of said light-receiving element or the light-emitting portions of said light-emitting element and the optical waveguide to each other; and
   forming an over cladding layer for covering the remaining portion of the protruding core pattern of said optical waveguide.

2. A method of manufacturing an optical waveguide device according to claim 1, wherein a transparent mold made of at least one selected from the group consisting of quartz glass and silicon is used as said mold, whereby the interior of the mold is seen through the mold when the mold is positioned so that the top surfaces of the protruding portions formed in the mold lie over the light-receiving portions of the light-receiving element or the light-emitting portions of the light-emitting element.

* * * * *